United States Patent
Qian et al.

(10) Patent No.: US 8,982,586 B2
(45) Date of Patent: Mar. 17, 2015

(54) METHOD FOR REGULATING TEMPERATURE OF TRANSISTOR-BASED COMPONENT

(75) Inventors: Lewei Qian, Peoria, IL (US); Matthew Hendrickson, Dunlap, IL (US); David Marchand, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 1026 days.

(21) Appl. No.: 12/977,877

(22) Filed: Dec. 23, 2010

(65) Prior Publication Data
US 2012/0163055 A1 Jun. 28, 2012

(51) Int. Cl.
*H02M 1/32* (2007.01)
*H03K 17/08* (2006.01)

(52) U.S. Cl.
CPC .......... *H02M 1/32* (2013.01); *H02M 2001/327* (2013.01); *H03K 2017/0806* (2013.01)
USPC ............. 363/37; 307/10.1; 327/512; 219/488

(58) Field of Classification Search
CPC . H02M 7/757; H02M 1/32; H02M 2001/327; H03K 2017/0806
USPC ............... 307/9.1, 10.1; 363/34–38; 327/512; 219/482–489, 200–202
See application file for complete search history.

(56) References Cited

U.S. PATENT DOCUMENTS

| | | | | |
|---|---|---|---|---|
| 4,890,050 | A * | 12/1989 | Mackevich | 322/34 |
| 5,251,588 | A * | 10/1993 | Tsujii et al. | 123/142.5 R |
| 6,457,542 | B1 * | 10/2002 | Hosono et al. | 180/68.1 |
| 6,486,639 | B1 * | 11/2002 | Montret et al. | 322/29 |
| 6,630,810 | B2 * | 10/2003 | Takemasa et al. | 320/104 |
| 7,523,617 | B2 | 4/2009 | Venkatasubramanian et al. | |
| 7,538,523 | B2 * | 5/2009 | Kitamura et al. | 322/33 |

(Continued)

FOREIGN PATENT DOCUMENTS

| | | |
|---|---|---|
| EP | 2175484 | 4/2010 |
| JP | H05-24691 U * | 3/1993 |

OTHER PUBLICATIONS

"Application Characterization of IGBTs," International Rectifier, AN-990 rev 2, 20 pages, available at http://www.irf.com/technical-info/appnotes/an-990.pdf, 2004.

*Primary Examiner* — Gary L Laxton
*Assistant Examiner* — Kyle J Moody
(74) *Attorney, Agent, or Firm* — Finnegan, Henderson, Farabow, Garrett & Dunner, LLP (57) ABSTRACT

A method of regulating temperature of a transistor-based component of a power system is disclosed. The method may include operating the power system to supply electric power to the transistor-based component and converting the electric power from direct current to alternating current, or alternating current to direct current, using the transistor-based component, thereby creating heat in the transistor-based component. The method may include outputting the electric power from the transistor-based component and supplying the electric power to an electrically-powered component to perform an output operation. The method may include controlling, during a predetermined system operating condition, one or more operations of a component associated with the power system to actively generate heat to thereby maintain the temperature of the transistor-based component higher than from the conversion of electric power that is performed to produce the electric power used to perform the output operation during the predetermined system operating condition.

20 Claims, 6 Drawing Sheets

(56) References Cited

U.S. PATENT DOCUMENTS

| | | | |
|---|---|---|---|
| 7,599,196 B2* | 10/2009 | Alexander | 363/13 |
| 7,823,671 B2* | 11/2010 | Inoue et al. | 180/68.4 |
| 2002/0051368 A1* | 5/2002 | Ulinski et al. | 363/1 |
| 2007/0175890 A1* | 8/2007 | Suenaga et al. | 219/716 |
| 2010/0045103 A1* | 2/2010 | Mitsutani | 307/9.1 |
| 2010/0052583 A1* | 3/2010 | Takamatsu et al. | 318/400.09 |
| 2010/0100266 A1* | 4/2010 | Yoshinori et al. | 701/22 |
| 2010/0301038 A1* | 12/2010 | Weiss et al. | 219/660 |
| 2011/0303395 A1* | 12/2011 | Mori et al. | 165/104.34 |

* cited by examiner

METHOD FOR REGULATING TEMPERATURE OF TRANSISTOR-BASED COMPONENT

TECHNICAL FIELD

The present disclosure is directed to a method of regulating the temperature of a transistor-based component and, more particularly, to a method of maintaining the temperature of transistor-based components during predetermined operating conditions.

BACKGROUND

Thermal conditions of the environment within which an electronic component operates are known to have an effect on the durability/longevity of the component. Electronic components are affected by both high temperatures and low temperatures. The materials with which a component is made, and the relative robustness of the component (i.e., how sturdy its pieces are), must be selected to withstand the temperatures within which the component will operate, taking into consideration not only the atmospheric conditions, but also the heat that the components around it, and the component itself generate. In addition, cooling systems of electronic components are also designed accordingly.

Further, electronic components can be vulnerable to, not only temperature extremes, but also to repeated changes in temperature during operation. Electronic components are often made of multiple different materials (e.g., silicon and metal), wherein some materials have different rates of thermal expansion than others. The repeated expansion and contraction of adjoining elements of an electronic component at different rates can eventually cause one or more of the elements (or the junction between them) to fail.

In some cases, there may be factors that limit the degree to which a component may be strengthened and/or the amount of cooling that may be supplied to the component. Such factors may include packaging constraints (e.g., size and shape), weight limits, cost, etc. Thus, it may be desirable to manage not only the maximum and minimum temperatures to which an electronic component is subjected, but also the fluctuations in the temperatures during the operation of the component.

Systems have been developed that regulate the cooling of electronic components. For example, European Patent Application No. EP 2175484 ("the '484 publication") discloses a system configured to regulate the cooling efficiency (e.g., flow rate of cooling fluid) of a heat sink for an electronic component, by implementing a feedback system based on the temperature of the component. By providing a reduced flow of cooling fluid during operating conditions that do not create large amounts of heat, the system prevents the coolant flow from significantly reducing the temperature of the component during such conditions, thereby reducing the variations in temperatures experienced by the component.

The cooling capacity of a cooling system and the robustness of an electronic component may, in some cases, be "maxed-out" or changes may be otherwise impractical and/or undesirable considering manufacturing and/or business parameters. The system disclosed in the '484 publication appears to utilize a high capacity cooling system and merely turns the coolant flow down or off during operating conditions that do not create high component temperatures. However, it may not always be practical to use a cooling system with higher and higher cooling capacity.

Further, the system of the '484 publication controls the lower end of the temperature variation by turning the coolant flow down or off. However, in some situations, this passive approach to limiting the temperature drop during less strenuous operating conditions may be insufficient. For example, the low stress operation may endure for a length of time that allows the electronic component to cool significantly, even without application of cooling. It may be desirable to implement an active process by which component temperatures are sustained at higher levels during low stress operations.

The present disclosure is directed to improvements in thermal management of electronic components.

SUMMARY

In one aspect, the present disclosure is directed to a method of regulating a temperature of a transistor-based component of a power system. The method may include operating the power system to supply electric power to the transistor-based component and converting the electric power from direct current to alternating current, or alternating current to direct current, using the transistor-based component, thereby creating heat in the transistor-based component as a by-product of the conversion. In addition, the method may include outputting the electric power from the transistor-based component and supplying the electric power to an electrically-powered component, and operating the electrically-powered component to perform an output operation. Also, the method may include controlling, during a predetermined system operating condition, one or more operations of a component associated with the power system. Controlling the component associated with the power system may be performed to actively generate heat to which the transistor-based component is subjected. The heat may be generated to thereby maintain the temperature of the transistor-based component at a higher temperature than it would experience from the conversion of direct current to alternating current, or alternating current to direct current, that is performed to produce the electric power used to perform the output operation during the predetermined system operating condition.

In another aspect, the present disclosure is directed to a power system. The power system may include a source of electric power configured to produce alternating current. In addition, the power system may include a transistor-based component configured to convert direct current to alternating current, or alternating current to direct current, thereby creating heat in the transistor-based component as a by-product of the conversion. The power system may include an electrically-powered component configured to receive the electric power output by the transistor-based component and perform an output operation. Also, the power system may include a controller configured to control, during a predetermined system operating condition, one or more operations of a component associated with the power system. Controlling the component associated with the power system may be performed to actively generate heat to which the transistor-based component is subjected. The heat may be generated to thereby maintain a temperature of the transistor-based component at a higher temperature than it would experience from the conversion of direct current to alternating current, or alternating current to direct current, that is performed to produce the electric power used to perform the output operation during the predetermined system operating condition.

In another aspect, the present disclosure is directed to a controller for controlling a power system having a transistor based component. The controller may include a processor configured to execute machine-readable instructions, and a memory including a computer-readable medium having stored thereon instructions, executable by the processor, for regulating a temperature of the transistor-based component. The temperature regulation may include operating the power system to supply electric power to the transistor-based component. In addition, the regulation may include converting the electric power from direct current to alternating current, or from alternating current to direct current, using the transistor-based component, thereby creating heat in the transistor-based component as a by-product of the conversion. Further, the regulation may include outputting the electric power from the transistor-based component and supplying the electric power to an electrically-powered component, and operating the electrically-powered component to perform an output operation. Also, the regulation may include controlling, during a predetermined system operating condition, one or more operations of a component associated with the power system. Controlling the component associated with the power system may be performed to actively generate heat to which the transistor-based component is subjected. The heat may be generated to thereby maintain the temperature of the transistor-based component at a higher temperature than it would experience from the conversion of direct current to alternating current, or alternating current to direct current, that is performed to produce the electric power used to perform the output operation during the predetermined system operating condition.

DETAILED DESCRIPTION

Reference will now be made in detail to the drawings. Wherever possible, the same reference numbers will be used throughout the drawings to refer to the same or like parts.

Figure 1:
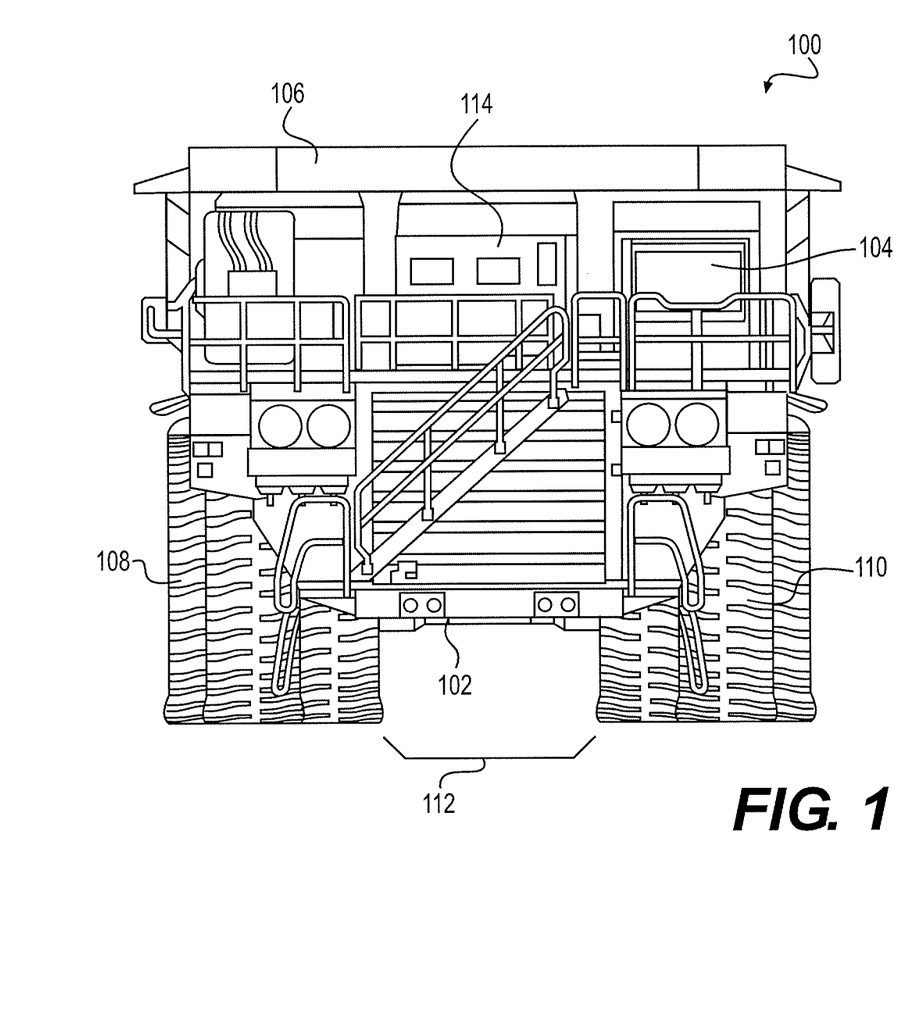
FIG. 1 is a front view of a machine according to an exemplary disclosed embodiment.
Figure 2:
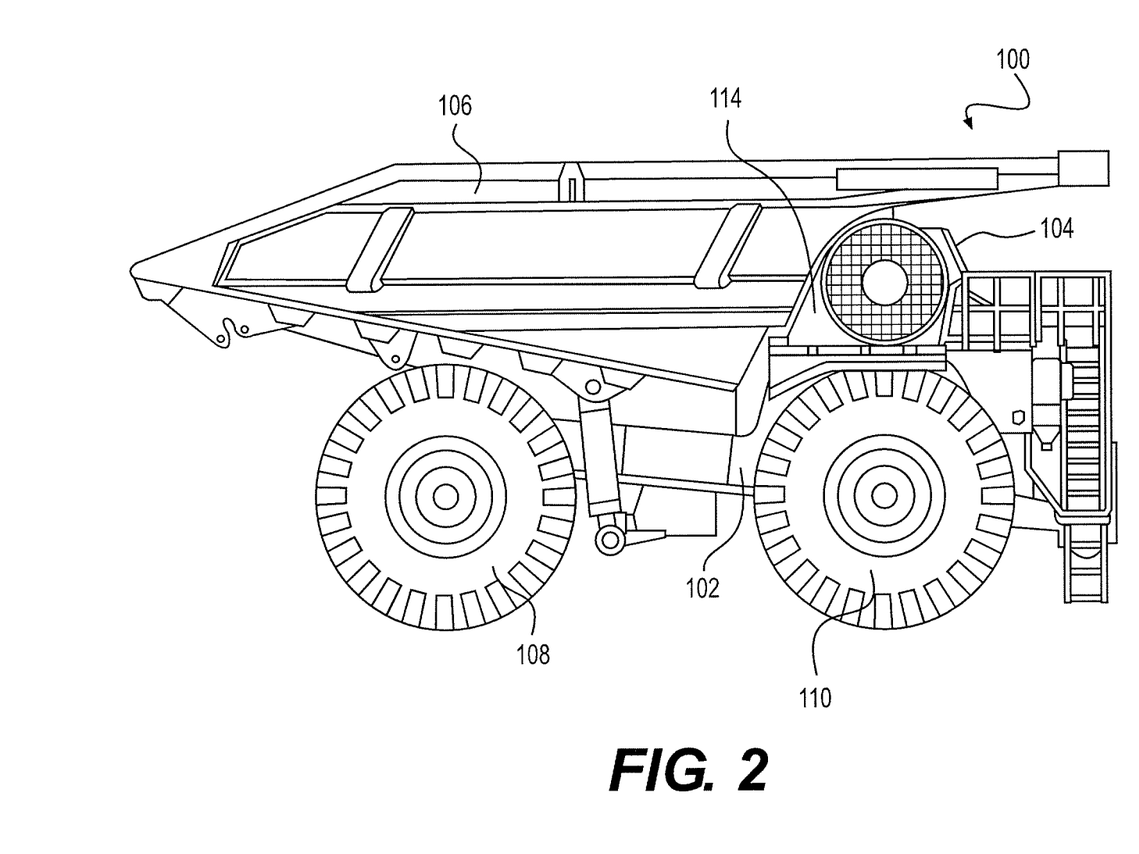
FIG. 2 is a side view of a machine according to an exemplary disclosed embodiment.

FIG. 1 and FIG. 2 illustrate, respectively, a front and a side view of a machine 100. Machine 100 may include a direct series electric drive system. In some embodiments, machine 100 may be an off-highway truck such as those used for construction, mining, or quarrying. The accompanying figures depict machine 100 as an off-highway truck. However, machine 100 may be embodied in any of a variety of types of machine that utilizes electrical power to power one or more of the machine's operations.

As shown in FIGS. 1 and 2, machine 100 may include a chassis 102, which may support, among other things, an operator cab 104. Machine 100 may be configured such that an operator occupying operator cab 104 may control the motion and the various functions of machine 100.

Chassis 102 may also support a bucket 106. Bucket 106 may be pivotally connected to chassis 102 and may be configured to carry a payload.

Chassis 102 may support various drive system components. These drive system components may be configured to drive a set of traction devices. For example, as shown in the accompanying figures, the drive system components may be configured to drive a set of drive wheels 108 to propel the machine 100. In some embodiments, machine 100 may include a set of idle wheels 110, which may be configured to effectuate steering of machine 100.

In some embodiments more than one set of wheels may be driven. Further, in some embodiments, all wheels may be driven, including steerable wheels. In some embodiments, machine 100 may include an articulated chassis to effectuate steering. Such an articulated configuration may or may not include steerable wheels. Additionally, or alternatively, machine 100 may include other types of traction devices, such as tracks, belts, etc., which may be driven by electrical power.

Figure 3:
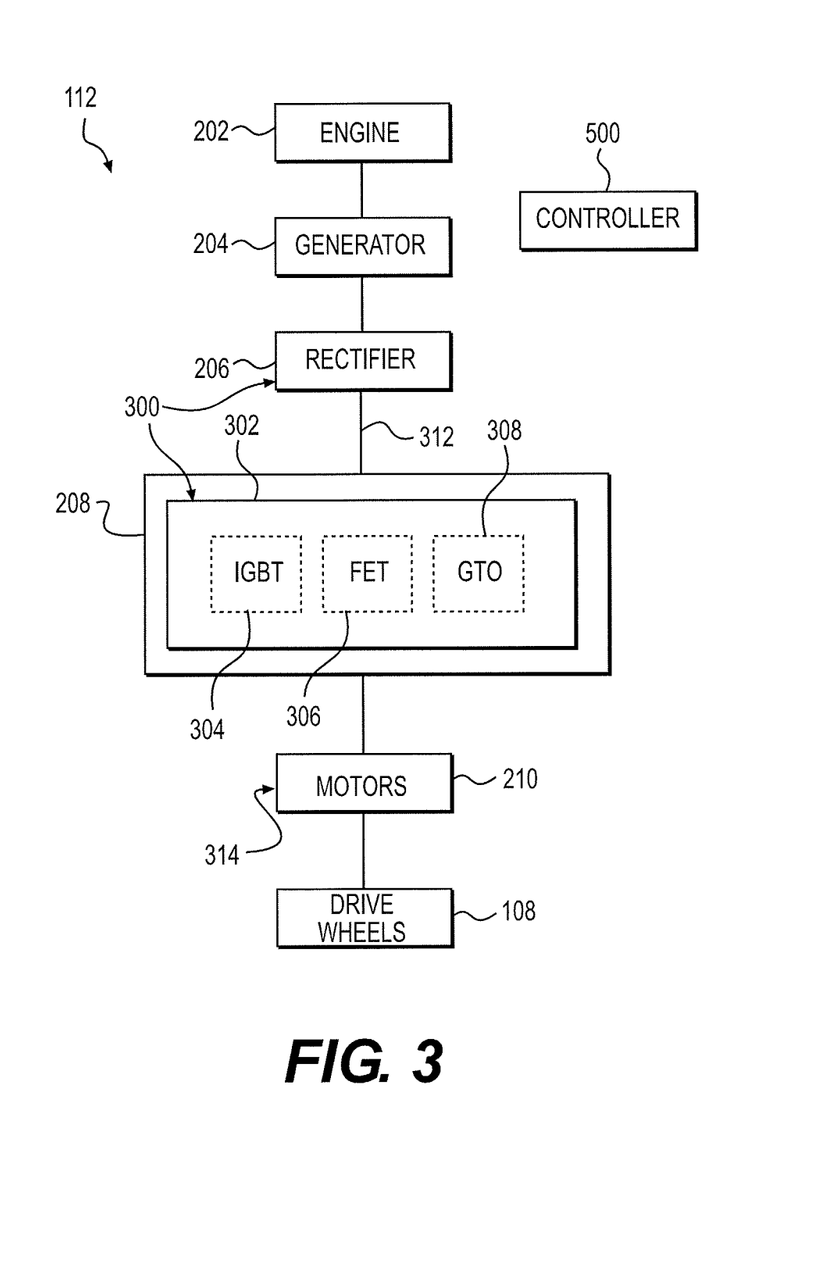
FIG. 3 is a block diagram representation of a power system according to an exemplary disclosed embodiment.

Machine 100 may include a power system 112. For example, in some embodiments, machine 100 may employ a direct series electric drive system, which, in this instance, refers to the use of more than one source or form of power to drive wheels 108. A block diagram for an exemplary power system of machine 100 is shown in FIG. 3. Power system 112 may include a source of electric power configured to produce alternating current. For example, as shown in FIG. 3, in some embodiments, power system 112 may include an engine 202, the output shaft (310, see FIG. 4) of which may be connected to a generator 204. In addition, power system 112 may include a rectifier 206 configured to convert alternating current output by generator 204 to direct current, a DC link 312 configured to deliver the direct current to a transistor-based component 300, which may be configured to convert the direct current back to alternating current, and an electrically-powered component 314 configured to perform an output operation utilizing the direct current output by transistor-based component 300. In addition, power system 112 may also include a controller 500 configured to control operation of power system 112. Further detail regarding these components of power system 112 is provided below.

Figure 4:
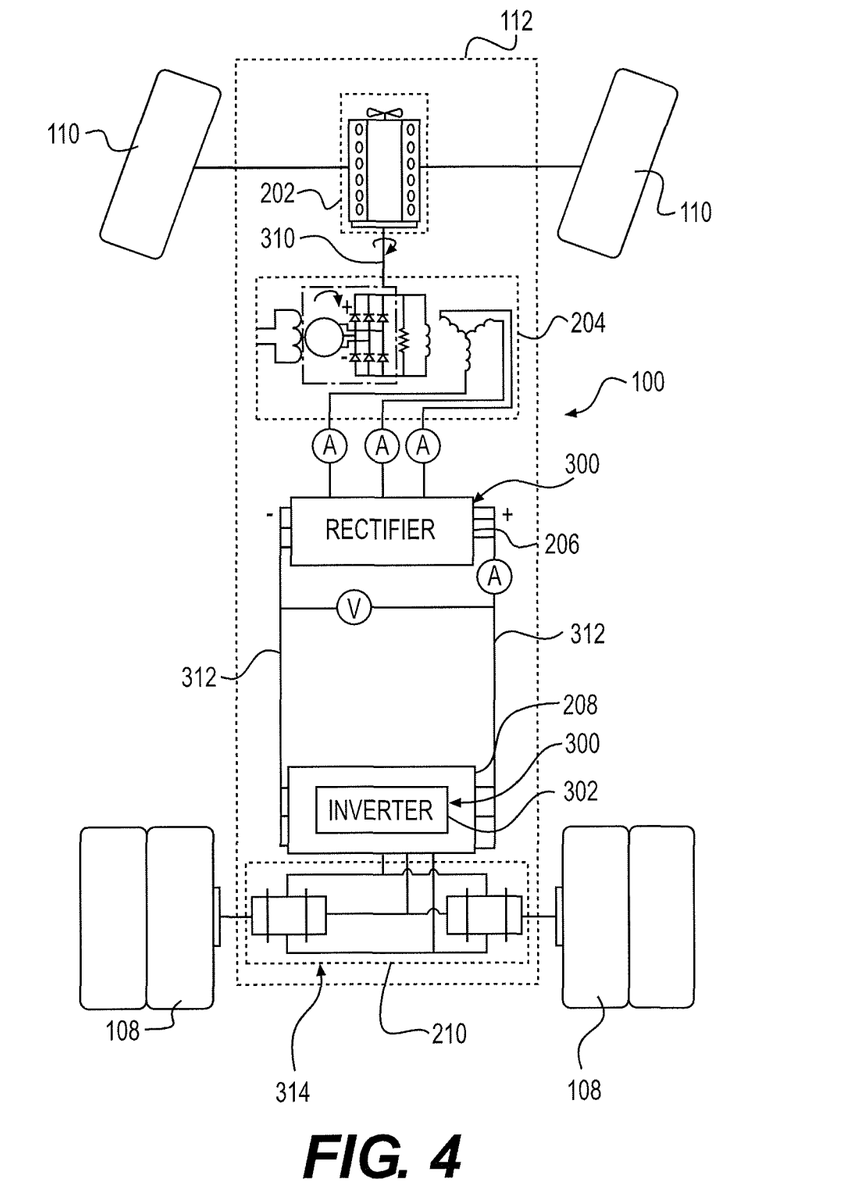
FIG. 4 is schematic block diagram of an exemplary power system as implemented in the machine of FIG. 1.

Engine 202 may be, for example, an internal combustion engine (such as a diesel engine), which may produce an output torque at an output shaft 310. As shown in FIG. 4, output shaft 310 of engine 202 may be connected to generator 204. During operation, output shaft 310 of engine 202 may rotate a rotor of generator 204 to produce electrical power, e.g., in the form of alternating current (AC). Although a direct connection to output drive shaft 310 is shown in FIG. 4, other drive components, such as a transmission or other gear arrangements, may be utilized to couple the output of engine 202 to generator 204.

When machine 100 is propelled, engine 202 generates mechanical power that is converted into electrical power, which is conditioned by various electrical components. In some embodiments, such components may be housed within a cabinet 114 (see FIG. 1). Cabinet 114 may be disposed on a platform that is adjacent to operator cab 104 and may include rectifier 206, transistor-based component 300, and/or other components.

Generator 204 may be any suitable generator (e.g., an alternator). The size, type, and capabilities of generator 204 may be appropriately selected by skilled artisans based on the energy source (e.g., engine 202) and the desired parameters for the output of generator 204 in various implementations of the disclosed power system concepts.

Rectifier 206 may be configured to receive the electrical power produced by generator 204 and may be configured to convert the alternating current to direct current (DC) and deliver the DC power to transistor-based component 300 via DC link 312. Rectifier 206 may be any type of rectifier suitable for the chosen application.

Electrically-powered component 314 may be any component configured to perform an output operation utilizing the AC power output by transistor-based component 300. For example, electrically-powered component may include one or more electric motors 210. Power system 112 may be configured to control the speed or torque of motors 210, e.g., by controlling the frequency and/or the pulse-width of the AC output of transistor-based component 300. Motors 210 may be connected via final assemblies (not shown) or directly to components of machine 100. For example, as shown in FIG. 4, motors 210 may be operably connected to drive wheels 108 of machine 100. Thus, in the illustrated embodiment, motors 210 are configured to turn drive wheels 108 as an output operation. Under certain predetermined operating conditions, the output operation of motors 210 may include remaining stationary (i.e., not producing torque to drive drive wheels 108). Under such conditions, a reduced amount of current may be supplied to motors 210 in order to keep them fluxed, thus providing responsiveness. Drive motors 210 may be directly connected to drive wheels 108 or may power final drives that power the drive wheels 108. Final drives, as are known, may operate to reduce the rate of rotation and increase the torque between each drive motor 210 and each set of drive wheels 108.

In other embodiments, other electrically-driven components may be included in, or otherwise powered by, power system 112. For example, in some embodiments, various types of electrically-powered work tools or machine functions may be powered by the output of transistor-based component. Examples may include boom swing of an excavator, as well as work tools having components that are actuated by electric motors (e.g., servos).

Transistor-based component 300 may be configured to convert the DC power to AC power or AC power to DC power. In some embodiments, transistor-based component 300 may be an inverter 302, which may be part of an inverter circuit 208. In some embodiments, transistor-based component 300 may include an active rectifier. In such embodiments, rectifier 206 may be an active rectifier, and thus, may be a transistor-based component 300. Exemplary transistor-based components may include an insulated gate bipolar transistor (IGBT) 304, a field-effect transistor (FET) 306, and/or a gate turnoff (GTO) 308, as shown in FIG. 3. In certain embodiments, transistor-based component 300 will include only one of these types of components, as indicated by the dashed boxes within which these elements are shown in FIG. 3. Inverter circuit 208 may be configured to selectively adjust the frequency and/or pulse-width of its output, such that motors 210, connected to an output of inverter circuit 208, may be operated at variable speeds.

Schematic diagrams of the direct series electric drive system of machine 100 are shown in FIG. 3 and FIG. 4. The block diagram of FIG. 4 includes a particular embodiment with component examples that can be included in the functional blocks shown in FIG. 3. Hence, the block diagrams shown in FIG. 3 and FIG. 4 may be referred to together when considering the description that follows.

When power is supplied from the output of generator 204, rectifier 206 operates to provide wave rectification of each of the phases of the three-phase alternating current. Rectifier 206 may develop a voltage across DC link 312. This DC link voltage may be available at a first rail and a second rail of DC link 312. The first rail is typically at a first voltage, and the second rail is typically at a second voltage during operation. Either of the first and second voltages may be zero. In addition, during operation, a voltage may be developed across the first and second rails of the DC link 312 by the inverter circuit 208.

Inverter circuit 208 may operate to transform the DC voltage (received from DC link 312) into variable frequency sinusoidal or non-sinusoidal AC power that drives, in this example, drive motors 210. Any known inverter may be used for the arrangement of the inverter circuit 208. Inverter circuit 208 may include three phase arrays of insulated-gate bipolar transistors (IGBT) 304. IGBTs 304 may be arranged in transistor pairs and may be configured to supply a 3-phase AC output to each of drive motors 210.

The conversion of DC to AC or AC to DC may create heat in transistor-based component 300 as a by-product of the conversion. Power system 112 may be configured to regulate the temperature of transistor-based component 300 using one or more techniques/features. Controller 500 may be configured to implement at least some of these techniques/features, as discussed in greater detail below.

Figure 5:
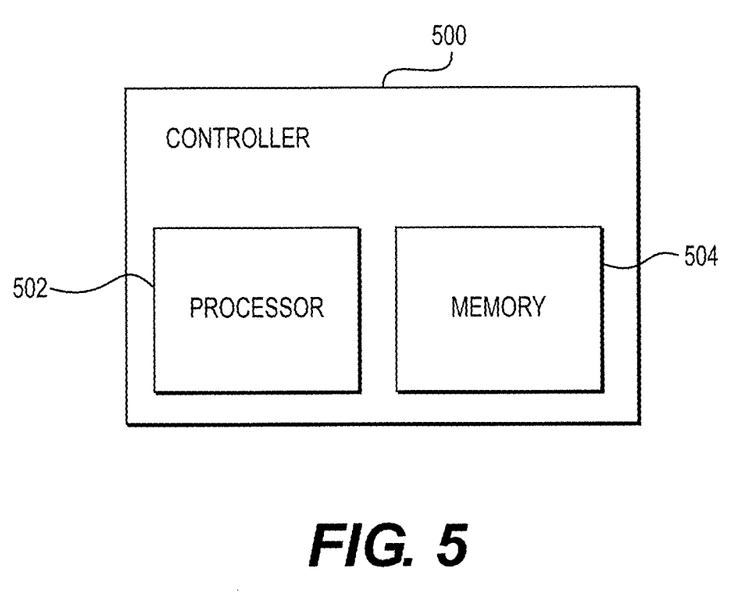
FIG. 5 is a block diagram representation of a controller according to an exemplary disclosed embodiment.

As shown in FIG. 5, controller 500 may include a processor 502 configured to execute machine-readable instructions, and a memory 504 including a computer-readable medium having stored thereon instructions, executable by processor 502, for regulating the temperature of transistor-based component 300. Memory 504 may include instructions for operating power system 112 to supply electric power, in the form of direct current, to transistor-based component 300 and converting the electric power from direct current to alternating current using transistor-based component 300, thereby creating heat in the transistor-based component as a by-product of the conversion. Memory 504 may also include instructions for outputting the alternating current from transistor-based component 300 and supplying the alternating current to electrically-powered component 314, and operating electrically-powered component 314 to perform an output operation (exemplary output operations are discussed above).

Controller 500 may be a single controller or may include more than one controller disposed to control various functions and/or features of machine 100. For example, a master controller, used to control the overall operation and function of the machine, may be cooperatively implemented with a motor or engine controller used to control the engine 202. As used herein, the term "controller" includes one, two, or more controllers associated with machine 100 that cooperate in controlling various functions and operations of machine 100.

Controller 500 may receive information concerning the operation of the electric drive system of the machine 100. For example, controller 500 may receive information indicative of engine operating parameters. Such engine operating parameters may include engine speed, engine load, torque output, the presence of engine faults, or other parameters that concern the operating state of the engine.

Controller 500 may also be configured to receive information from a temperature sensor (not shown), which may be configured to measure the temperature of transistor-based component 300. In some embodiments, controller 500 may be configured to regulate the operations of power system 112 based on the information received from the temperature sensor.

Controller 500 may operate in a logical fashion to perform operations, execute control algorithms, store and retrieve data, etc. In some embodiments, controller 500 may be configured to access memory 504, which may contain, for example, one or more tables (or other appropriate data organization) containing addressable elements of data. Memory 504 may be in the form of read only memory (ROM), random access memory (RAM), or integrated circuitry that is accessible by electronic controller 500 or integrated therewith.

Controller 500 may be configured to control, during a predetermined system operating condition, one or more operations of a component associated with power system 112 to actively generate heat to which transistor-based component 300 is subjected. By actively generating heat to which transistor-based component 300 is subjected, power system 112 may thereby maintain the temperature of transistor-based component 300 at a higher temperature than it would experience from the conversion of direct current to alternating current that is performed to produce the alternating current used to perform the output operation during the predetermined system operating condition.

As used in the present disclosure, the term "associated," in the context of an exemplary component "associated" with power system 112 that may be operated to generate heat to which transistor-based component 300 may be subjected, refers to any component of machine 100 that is configured to create heat to which transistor-based component 300 may be subjected. That is, the "association" between the component and transistor-based component 300 is the configuration of machine 100 to apply heat generated by the component to transistor-based component 300. Such components may be either external to power system 112 or part of power system 112, During operating conditions that do not involve a high level of current flow/conversion in transistor-based component 300, transistor-based component 300 may cool significantly. Controller 500 may be configured to control one or more operations of machine 100 and/or power system 112 to generate heat to which transistor-based component 300 may be subjected, in order to prevent the temperature of transistor-based component 300 from dropping or to limit the temperature drop, thereby reducing the temperature variation experienced by transistor-based component 300.

Exemplary predetermined system operating conditions where this may be desirable may include idling of machine 100. An idle condition, as used herein, includes any operating mode of machine 100 during which engine 202 and/or generator 204 is operating but there is no electrical power or very little electrical power being consumed. For example, in the disclosed example wherein machine 100 is an off-highway truck, when machine 100 remains stationary, electric motors 210 are not consuming electrical power to turn drive wheels 108. Under such conditions, a reduced amount of current is being converted by transistor-based component 300.

In some embodiments, controller 500 may be configured to control one or more operations of a component associated with power system 112 to actively generate heat by regulating one or more parameters of the current being converted by transistor-based component 300. The following exemplary methods are discussed using an inverter as transistor-based component 300. However, these techniques are applicable to any transistor-based component that operates similarly.

Inverter 302 may operate at a variable switching frequency (i.e., the frequency of the pulses output to convert the incoming direct current to alternating current or to convert alternating current to direct current). In some embodiments, regulation, by controller 500, of one or more parameters of the current being converted by inverter 302 may include regulating the switching frequency of inverter 302. For example, by increasing the switching frequency (without increasing the amplitude of the pulses) of inverter 302 during idling of machine 100, additional heat may be created in inverter 302 without creating any torque at motors 210 that would be applied to drive wheels 108. Each pulse of inverter 302 results in an energy loss, which comes in the form of heat (i.e., the aforementioned by-product of converting DC to AC). By increasing the number of pulses (i.e., increasing the switching frequency), the number of loss events for a given period of time may be increased, thus resulting in an increase in the amount of heat created in inverter 302. This may be implemented to limit the extent to which the temperature of inverter 302 drops during idling of machine 100.

In some embodiments, the regulation by controller 500 of one or more parameters of the current being converted by inverter 302 may include regulating the voltage of DC link 312. By increasing the voltage of DC link 312, the amount of loss (i.e., heat) created for each pulse of inverter 302 may be increased (because the amplitude of each pulse is larger). Therefore, while increasing switching frequency increases the number of loss events (as discussed above), increasing DC link voltage increases the amount of loss for each event, resulting in an overall increase in loss (i.e., heat) for the same number of events. The duration of each pulse of inverter 302 may be reduced in order to maintain the same sinusoidal output of inverter 302, so as to avoid creating torque at motors 210, even though the amplitude of the inverter pulses is increased.

In addition, while switching frequency of inverter 302 and/or DC link voltage may be increased without resulting in a change in the sinusoidal alternating current output of inverter 302, in some embodiments, the output may actually be changed without causing any torque to be created at motors 210. For instance, in the example of induction motors, torque is created by changing the frequency of the alternating current supplied to the motors. Therefore, a change in the amplitude of the current would not create any torque, as long as the frequency remained the same. Accordingly, inverter 302 may be operated using an increased DC link voltage and/or an increased switching frequency that results in a sinusoidal alternating current output having a larger amplitude but the same frequency. This may result in an increase in the heat produced by inverter 302, but would not cause any torque to be created by motors 210. Thus, in some embodiments, the regulation, by controller 500, of one or more parameters of the current being converted by inverter 302 may include regulating the amplitude of the alternating current output by inverter 302. This may also be referred to as regulating motor flux or motor fluxing current.

It will be understood that the foregoing techniques (i.e., increasing switching frequency, increasing DC link voltage, and increasing the amplitude of inverter output) may be implemented either alone or in various combinations to generate additional heat during certain predetermined operating conditions.

Additionally, or alternatively, in some embodiments, controller 500 may be configured to control one or more operations of a component that is associated with power system 112 to cause heat from a source external to transistor-based component 300 to be applied to transistor-based component 300. For example, machine 100 may include various components that produce heat during operation. Exemplary such components may include controller 500, engine 202, exhaust and transmission components, etc. In some embodiments, heat from such components may be selectively allowed to be transferred (e.g., by convection and/or thermal conduction) to transistor-based component 300 under certain operating conditions. Such selective transfer may be implemented, for example, by movement of heat-shielding components (e.g., panels, etc.) between the heat-generating components and transistor-based component 300.

INDUSTRIAL APPLICABILITY

The disclosed power system 112 may be applicable to many types of machines and environments. One exemplary machine suited to the disclosure is an off-highway truck often used in mines, construction sites, and quarries. In such environments, off-highway trucks may be used in a substantially cyclical manner. For example, such trucks may be used to transport a large quantity of material from one location to another by carrying multiple loads. In such cases, the trucks may repeat a cycle that includes sitting (i.e., idling) for an amount of time while a loading machine (e.g., a front end loader, excavator, etc.) loads the bucket or bed of the truck. While the truck remains stationary during loading, there is little or no demand for DC to AC conversion by inverter 302, since motors 210 are not being engaged to propel drive wheels 108. This can result in a significant decrease in the temperature of inverter 302. The temperature of inverter 302 then increases during the transport phase of the cycle. The repeated heating and cooling has been determined to lead to failure of inverter components. Accordingly, the disclosed system may be applicable to maintain temperatures of inverter 302 at higher levels during idling in the aforementioned types of environments. Power system 112 may also take into consideration ambient temperatures when regulating the temperature of transistor-based component.

Further, the methods and systems described above can be adapted to a large variety of machines and tasks. For example, other types of industrial machines, such as backhoe loaders, compactors, feller bunchers, forest machines, industrial loaders, skid steer loaders, wheel loaders, excavators, and many other machines can benefit from the methods and systems described.

Figure 6:
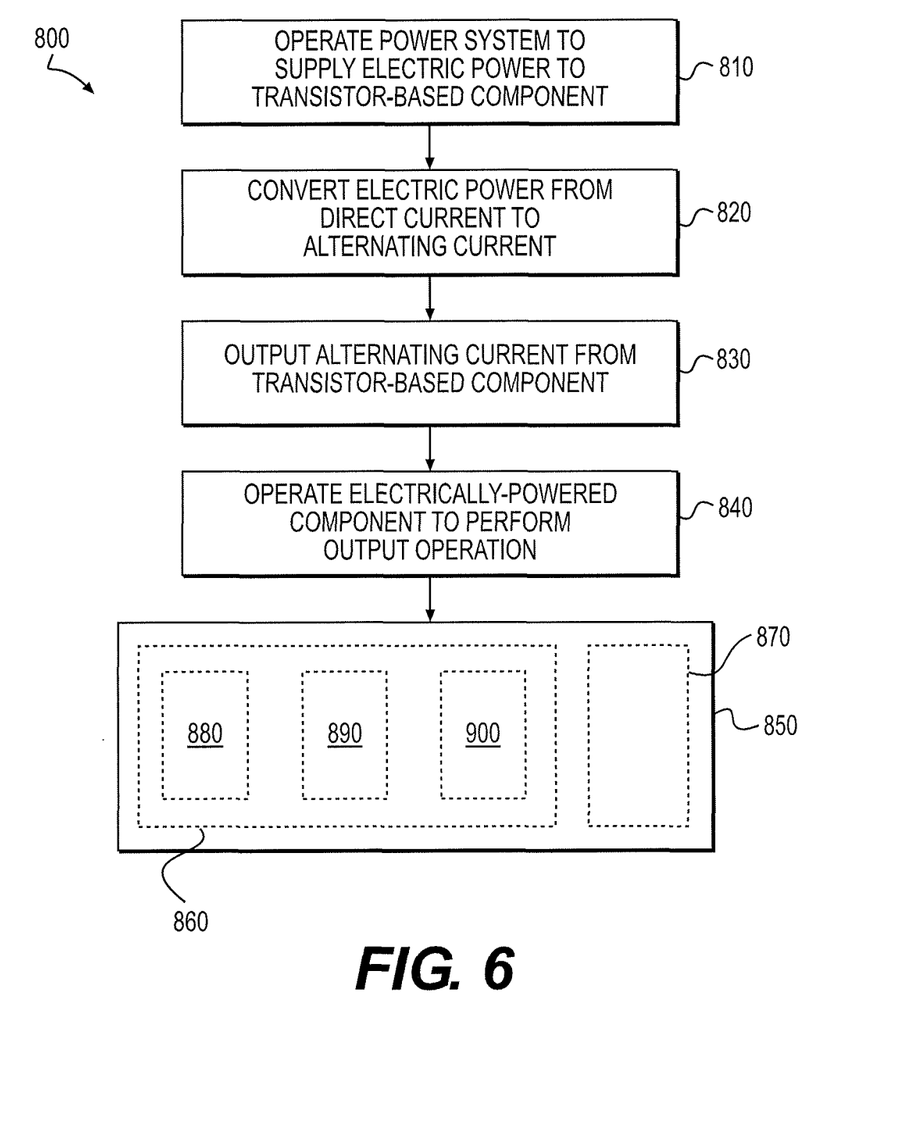
FIG. 6 is a flow chart illustrating an exemplary process of regulating temperature of a transistor-based component.

FIG. 6 is a flow chart illustrating a process 800 of regulating the temperature of transistor-based component 300 of power system 112. Process 800 may be executed by electronic controller 500 via the execution of computer-executable instructions, e.g., in machine language form or otherwise read from a computer-readable medium, such as a magnetic or optical disc or other tangible medium.

Step 810 of process 800 may include operating power system 112 to supply electric power to transistor-based component 300. At step 820, process 800 may include converting the electric power from direct current to alternating current using transistor-based component 300, thereby creating heat in transistor-based component 300 as a by-product of the conversion. Step 830 may include outputting the alternating current from transistor-based component 300 and supplying the alternating current to electrically-powered component 314. Further, step 840 may include operating electrically-powered component 314 to perform an output operation.

Step 850 may include controlling one or more operations of a component associated with the power system to actively generate heat. For example, as discussed above, controller 500 may execute instructions for controlling, during a predetermined system operating condition, one or more operations of a component associated with the power system to actively generate heat to which the transistor-based component is subjected to thereby maintain the temperature of the transistor-based component at a higher temperature than it would experience from the conversion of direct current to alternating current during the predetermined system operating condition.

The present disclosure is directed to keep a transistor-based component from cooling off when a machine is idling by, for example, actively generating heat during idling. As described above, this process is depicted in FIG. 6 as step 850. This active generation of heat may be performed in any suitable way, including generating heat using components of machine 100 that are external to power system 112, managing operation of components that are part of power system 112, and/or by regulating the mode of operation of the transistor-based component itself by regulating one or more parameters of the current being converted by the transistor-based component during idling. The technique of regulating one or more parameters of the current being converted by the transistor-based component is represented by step 860. An additional or alternative technique may be performed by controlling one or more operations of a component that is associated with the power system (either part of the power system, or otherwise associated with it) to cause heat from a source external to transistor-based component to be applied to the transistor-based component. The additional or alternative technique of generating heat is depicted in FIG. 6 as step 870. Since steps 860 and 870 are possible techniques for accomplishing step 850, the boxes for steps 860 and 870 are shown within the box for step 850. Further, since step 850 may be performed using either step 860, step 870, or both, the boxes for step 860 and 870 are shown with dashed lines.

With further regard to step 860, the technique of regulating one or more parameters of the current being converted by the transistor-based component may include one or more of three different techniques depicted in FIG. 6. For example, regulating one or more parameters of the current being converted by the transistor-based component may include 1) increasing the switching frequency of the transistor-based component (step 880), 2) increasing the voltage of the DC Link (step 890), and/or 3) increasing the amplitude of the sinusoidal output of the transistor-based component (step 900). That is, techniques 1, 2, and 3 are exemplary ways (or substeps, since the techniques may be used together) of performing step 860 and, accordingly, are depicted in FIG. 6 as dashed boxes within the box for step 860.

It will be apparent to those having ordinary skill in the art that various modifications and variations can be made to the disclosed method and system for regulating a temperature of a transistor-based component without departing from the scope of the disclosed embodiments. Other embodiments of the disclosed system will be apparent to those having ordinary skill in the art from consideration of the specification and practice of the concepts disclosed herein. It is intended that the specification and examples be considered as exemplary only, with a true scope of the disclosed embodiments being indicated by the following claims and their equivalents.

What is claimed is:

1. A method of regulating a temperature of a transistor-based component of a power system, the method comprising:
    operating the power system to supply electric power to the transistor-based component;
    converting the electric power from direct current to alternating current, or alternating current to direct current, using the transistor-based component, thereby creating a first heat in the transistor-based component as a by-product of the conversion;
    outputting the converted electric power from the transistor-based component and supplying the converted electric power to an electrically-powered component;
    operating the electrically-powered component to perform an output operation;

controlling, during a predetermined system operating condition, one or more operations of a component associated with the power system to actively generate a second heat, to which the transistor-based component is subjected, to prevent the temperature of the transistor-based component from dropping or to limit a temperature drop of the transistor-based component, thereby reducing temperature variation experienced by the transistor-based component;

wherein the power system includes a mobile machine; and wherein the predetermined system operating condition includes idling of the mobile machine, and wherein idling includes any operating mode of the mobile machine during which an engine and/or a generator of the mobile machine is operating but there is no electrical power or substantially no electrical power being consumed by the engine and/or generator.

2. The method of claim 1, wherein the transistor-based component is an inverter or active rectifier.

3. The method of claim 2, wherein the inverter or active rectifier includes at least one of:
   an insulated gate bipolar transistor (IGBT);
   a field-effect transistor (FET); and
   a gate turnoff (GTO).

4. The method of claim 2, wherein controlling one or more operations of the component associated with the power system to actively generate the second heat includes regulating one or more parameters of the direct current or alternating current being converted by the inverter or active rectifier.

5. The method of claim 4, wherein the inverter or active rectifier operates at a switching frequency; and
   wherein regulating one or more parameters of the direct current or alternating current being converted by the inverter or active rectifier includes regulating the switching frequency of the inverter or active rectifier.

6. The method of claim 4, wherein the inverter is supplied with direct current via a DC link or the active rectifier is supplied with alternating current via a power source; and
   wherein regulating one or more parameters of the direct current or alternating current being converted by the inverter or active rectifier includes regulating a voltage of the DC link.

7. The method of claim 4, wherein the alternating current output by the inverter or received by the active rectifier has an amplitude; and
   wherein regulating one or more parameters of the direct current or alternating current being converted by the inverter or active rectifier includes regulating the amplitude of the alternating current.

8. A power system, comprising:
   a source of electric power configured to produce alternating current;
   a transistor-based component configured to convert the electric power from direct current to alternating current, or alternating current to direct current, thereby creating a first heat in the transistor-based component as a by-product of the conversion;
   an electrically-powered component configured to receive the alternating current output by the transistor-based component and perform an output operation;
   a controller configured to control, during a predetermined system operating condition, one or more operations of a component associated with the power system to actively generate a second heat, to which the transistor-based component is subjected, to prevent the temperature of the transistor-based component from dropping or to limit a temperature drop of the transistor-based component, thereby reducing temperature variation experienced by the transistor-based component;
   wherein the power system includes a mobile machine; and
   wherein the predetermined system operating condition includes idling of the mobile machine, and wherein idling includes any operating mode of the mobile machine during which an engine and/or a generator of the mobile machine is operating but there is no electrical power or substantially no electrical power being consumed by the engine and/or generator.

9. The system of claim 8, wherein the transistor-based component is an inverter or an active rectifier.

10. The system of claim 9, wherein the inverter or active rectifier includes at least one of:
    an insulated gate bipolar transistor (IGBT);
    a field-effect transistor (FET); and
    a gate turnoff (GTO).

11. The system of claim 9, wherein the controller is configured to control one or more operations of the component associated with the power system to actively generate the second heat by regulating one or more parameters of the direct current or alternating current being converted by the inverter or active rectifier.

12. The system of claim 11, wherein the inverter or active rectifier operates at a switching frequency; and
    wherein regulating one or more parameters of the direct current or alternating current being converted by the inverter or active rectifier includes regulating the switching frequency.

13. The system of claim 11, wherein the inverter is supplied with direct current via a DC link or the active rectifier is supplied with alternating current via a second power source; and
    wherein regulating one or more parameters of the direct current or alternating current being converted by the inverter or active rectifier includes regulating a voltage of the DC link.

14. The system of claim 11, wherein alternating current output by the inverter or received by the active rectifier has an amplitude; and
    wherein regulating one or more parameters of the direct current or alternating current being converted by the inverter or active rectifier includes regulating the amplitude of the alternating current.

15. The system of claim 8, wherein the controller is configured to control one or more operations of the component associated with the power system to cause heat from a source external to the transistor-based component to be applied to the transistor-based component.

16. A controller for controlling a power system having a transistor based component, comprising:
    a processor configured to execute machine-readable instructions; and
    a memory including a non-transitory computer-readable medium having stored thereon the machine-readable instructions, executable by the processor, for regulating a temperature of the transistor-based component by:
    operating the power system to supply electric power to the transistor-based component;
    converting the electric power from direct current to alternating current, or alternating current to direct current, using the transistor-based component, thereby creating a first heat in the transistor-based component as a by-product of the conversion;
    outputting the converted electric power from the transistor-based component and supplying the converted electric power to an electrically-powered component;

operating the electrically-powered component to perform an output operation;

controlling, during a predetermined system operating condition, one or more operations of a component associated with the power system to actively generate a second heat, to which the transistor-based component is subjected, to prevent the temperature of the transistor-based component from dropping or to limit a temperature drop of the transistor-based component, thereby reducing temperature variation experienced by the transistor-based component;

wherein the power system includes a mobile machine; and wherein the predetermined system operating condition includes idling of the mobile machine, and wherein idling, includes any operating mode of the mobile machine during which an engine and/or a generator of the mobile machine is operating but there is no electrical power or very little electrical power being consumed by the engine and/or generator.

17. The controller of claim 16, wherein controlling one or more operations of the component associated with the power system to actively generate the second heat includes regulating one or more parameters of the direct current or alternating current being converted by the transistor-based component.

18. The controller of claim 17, wherein the transistor-based component operates at a switching frequency, wherein regulating one or more parameters of the direct current or alternating current being converted by the transistor-based component includes regulating the switching frequency of the transistor-based component.

19. The controller of claim 17, wherein the transistor-based component is supplied with direct current via a DC link or alternating current via a power source; and wherein regulating one or more parameters of the direct current or alternating current being converted by the transistor-based component includes regulating a voltage of the DC link.

20. The method of claim 1, wherein controlling one or more operations of the component associated with the power system to actively generate the second heat to prevent the temperature of the transistor-based component from dropping or to limit the temperature drop of the transistor-based component includes accounting for ambient temperatures.

* * * * *